COMPLEMENTARY TRANSISTOR A. G. C. SYSTEM

Filed Oct. 1, 1954

INVENTORS:
ARTHUR P. STERN,
JOHN A. RAPER,
BY George V. Eltgroth
THEIR ATTORNEY.

United States Patent Office 2,882,350

Patented Apr. 14, 1959

2,882,350

COMPLEMENTARY TRANSISTOR AGC SYSTEM

Arthur P. Stern and John A. Raper, Syracuse, N.Y., assignors to General Electric Company, a corporation of New York Application October 1, 1954, Serial No. 459,804

4 Claims. (Cl. 179—171)

The present invention relates to amplification systems, and in particular to amplification systems employing semiconductor devices, such as transistors, in which it is desired to derive an amplified output signal whose amplitude is substantially independent of fluctuations in the amplitude of the applied signal.

The present invention belongs to the class of amplification systems which incorporate "automatic gain control." Such systems typically employ a succession of amplifier stages in one or more of which the forward gain may be controlled in response to a control voltage, and an auxiliary circuit for producing the control voltage and applying it to reduce the forward gain of the controlled amplifier stages. The control voltage is usually a direct voltage derived by operation on the amplified signal and in general, the amplitude of the control voltage is dependent on and increases with the increasing intensity of the applied signal. In production of a control voltage in an amplitude modulated signal, a rectifier may be employed for deriving a unidirectional voltage, which rectifier may be followed by a filter for eliminating any amplitude modulation components from the control voltage.

In achieving output amplitude stabilization, the present invention employs the principle of emitter current control, for control of the amplification of the transistor amplifier stages. Variation in the magnitude of the direct emitter current of a transistor amplifier is known to affect the amplification of an electric signal passing through the transistor. The relation between the amplification and the direct emitter current is known to be approximately exponential. By suitable reduction of the emitter current, consequently, it is possible to achieve a reduction in the amplification of the controlled stage. A second property arising from the exponential nature of the relation is that by suitable reduction in the emitter current by a fixed bias adjustment, a relatively sensitive portion of the amplification characteristic may be employed from which to effect amplification control in the presence of a control voltage dependent on signal amplitude.

It is an object of the present invention to provide an improved amplification system wherein the amplitude of the amplified output is substantially independent of the amplitude of the applied signal.

It is another object of the present invention to provide an amplification system of stabilized output amplitude in which the amplitude stabilizing properties of a transistor amplifier are substantially independent of fluctuations in supply voltage.

These and other objects are achieved in a novel amplifying system employing semiconductor devices of the type having at least three electrodes. The amplification system employs a first transistor in an amplification stage which is of a type complementary to a subsequent transistor used to derive a control voltage. The control voltage so derived is used to vary the emitter current of the controlled transistor for adjustment of its amplification. In preferred arrangements, the control voltage is produced in the emitter circuit of the control voltage producing transistor, and the control voltage is applied directly to the base of the controlled transistor for control of the emitter current. Further advantages in a receiver of amplitude modulated signals are achieved by using the transistor which derives a control voltage as a demodulator.

The features of the invention which are believed to be novel are set forth with particularity in the appended claims. The invention itself, however, both as to its organization and method of operation, together with further objects and advantages thereof, may best be understood by reference to the following description when taken in connection with the following drawings, wherein:

Figure 1:
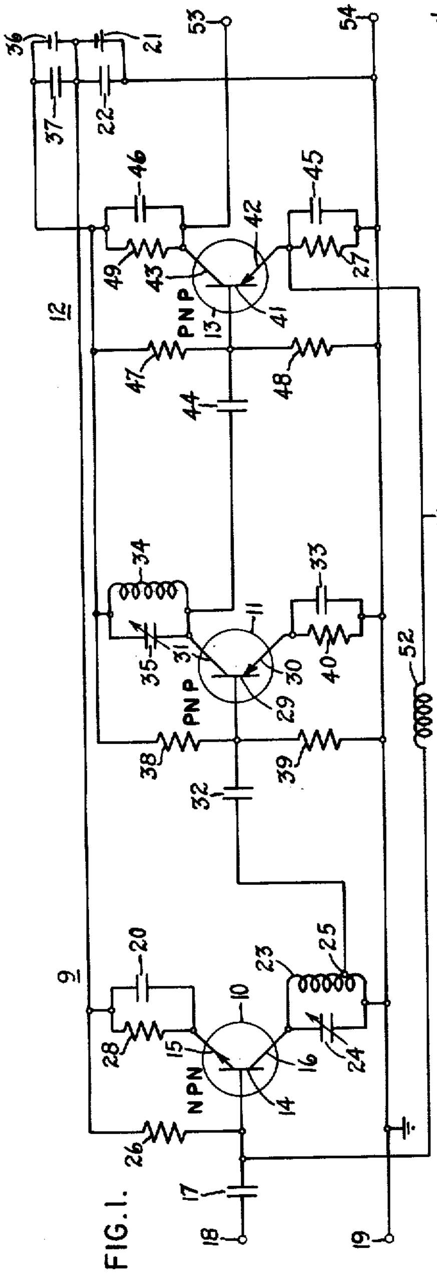
Fig. 1 is a first embodiment of the present invention adapted to serve as the amplifier and demodulator of an amplitude modulated signal.

A first embodiment of the invention is illustrated in Fig. 1. In performance of the function of controllably amplifying an applied signal, this embodiment is adapted to serve as the intermediate frequency amplifier and as the first detector of a radio receiver of amplitude modulated signals. The amplifier portion 9 employs two transistors 10 and 11 while the detector and control voltage producing portion 12 employs a single transistor 13. The transistor 10, which is subject to control, is of the NPN type and in accordance with the invention is of a type complementary to transistor 13 of the PNP type, which derives the control voltage.

The electrodes of transistor 10, consisting of a base electrode 14, an emitter electrode 15, and a collector electrode 16, are connected in a grounded emitter configuration. The base electrode 14 is connected to one terminal of coupling capacitor 17 whose other terminal is coupled to the amplifier input terminal 18. The other amplifier input terminal 19 is connected to ground. Emitter 15 is connected to one terminal of a capacitor 20 which has a low impedance with respect to signal voltages. The other terminal of capacitor 20 is connected to the negative terminal of a source 21. The positive terminal of source 21 is grounded. Capacitor 22, also having a low impedance with respect to signal frequencies, shunts the source 21 and provides in cooperation with capacitor 20 a low impedance path to signal voltages between emitter 15 and ground for grounded emitter operation. A tuned circuit comprising an inductance 23 and a capacitor 24, shunting the inductance, form a parallel resonant load circuit for the collector 16. One terminal of the parallel resonant circuit is connected to the collector electrode 16 and the other terminal is grounded. Inductance 23 is further provided with a tap 25 at the proper impedance level for connection to the succeeding amplifier stage.

Bias potentials are supplied to the transistor 10 from the source 21 by means of resistances 26, 27 and 28 and the inductance 23 which connects the collector electrode 16 to ground. Resistances 26 and 27 are serially connected between the negative terminal of source 21 and ground and have their common terminal connected to the base electrode 14. Resistance 28 is coupled between the emitter electrode 15 and the negative terminal of source 21.

A second grounded emitter amplification stage is provided employing the transistor 11. The transistor 11 may be either a PNP or an NPN type transistor. A PNP transistor is shown having a base electrode 29, an emitter electrode 30, and a collector electrode 31. Coupling capacitor 32 is connected between the base electrode 29 and the output tap 25 of the load inductance of the first transistor amplifier. The emitter electrode 30 is coupled through a capacitor 33 to ground. The capacitor 33 has a low impedance with respect to applied signal voltages to establish grounded emitter operation. The collector 31 of the transistor 11 is connected to one terminal of a parallel resonant circuit comprising an inductance 34 and a capacitance 35 connected in shunt therewith. The remote terminal of the parallel resonant circuit is connected to the negative terminal of a second source 36 of bias potentials. The positive terminal of source 36 is connected to the negative terminal of source 21. A capacitor 37 connected in shunt with the source 36 provides a low impedance path at signal frequencies between the terminals of source 36.

Energization of the transistor 11 is supplied from the combined potentials of sources 36 and 21 in cooperation with the inductance 34 and resistances 38, 39 and 40. As previously noted, the inductance 34 provides a path for energization of the collector electrode 31. Resistances 38 and 39 each having one terminal jointly connected to the base electrode 29, are serially connected between the negative terminal of source 36 and ground. The emitter 30 is coupled through resistance 40 to ground.

The portion 12 of the circuit which is used for demodulation and production of a control voltage employs a transistor 13 of the type which, according to the invention is complementary to that of the transistor which is subject to control. Since transistor 10 is an NPN type transistor, transistor 13 is a PNP type transistor. The transistor 13 has a base electrode 41, an emitter electrode 42 and a collector electrode 43 and is adjusted to operate as a rectifier or detector of a signal voltage applied between the base and emitter. The base electrode 41 is connected through a capacitance 44 to the collector electrode 31 of the transistor 11 in the preceding stage. A capacitance 45 connected between the emitter 42 and ground provides a low impedance path to alternating voltages between the emitter and ground. Capacitance 46 coupled between the collector 43 and the negative terminal of source 36 provides a low impedance path to signals of radio frequency while presenting a high impedance path to signals of modulation frequency.

Operating biases for the transistor 13 are supplied by the sources 36 and 21 in conjunction with resistances 47, 48, 49 and 27. Resistances 47 and 48 are serially connected between the negative terminal of source 36 and ground, their common terminal being connected to the base 41. Resistance 49 is connected between the collector electrode 43 and the positive terminal of source 36. Resistance 27 is connected between the emitter 42 and ground.

The emitter 42 of transistor 13 is coupled to the base 14 of transistor 10 through the automatic gain control bus 51 and an inductance 52. The inductance 52 is of high impedance to signals of carrier frequency. Capacitance 45 is of such a value as to provide an essentially steady voltage at the base of transistor 10 which is relatively free of audio frequency variations.

Values which have been found to facilitate effective detection and control voltage production with a junction type transistor are as follows:

| | | |
|---|---|---|
| Source 21 | volts | 2 |
| Source 36 | do | 4 |
| Resistance 47 | ohms | 91,000 |
| Resistance 48 | do | 18,000 |
| Resistance 49 | do | 5,000 |
| Resistance 27 | do | 4,700 |
| Inductance 52 | millihenry | 1 |

Output terminals for the embodiment of Fig. 1 are shown at 53 and 54. Collector 43 is connected to output terminal 53. Output terminal 54 is connected to ground.

Operation of the embodiment illustrated in Fig. 1 may now be considered in the amplification of a modulated signal. An amplitude modulated signal of radio frequency is applied to the terminals 18 and 19. The signal voltages are fed through capacitor 17 to the base electrode 14 and establish signal current flow through the base emitter circuit of transistor 10. The current injected into the base 14 induces a corresponding current in the collector circuit, and causes the production of a potential in the collector load impedance tank circuit. The tank circuit comprising inductance 23 and capacitance 24 is tuned to resonate at the frequency of the desired applied signals. Signals of the proper frequency are produced across the inductance 23 at potentials relatively increased with respect to signals of adjacent frequencies. Amplified potentials appearing in the inductance 23 are then derived at proper impedance level at the tap 25 and applied through the capacitor 32 to the base of the transistor 11 in the succeeding stage to establish signal currents therein.

In the interest of amplification control sensitivity, the preferred operating bias of transistor 10 is such as to provide, with a zero applied signal, a relatively low current in the base emitter circuit. In a typical junction transistor, the bias may be adjusted to such a value that the static emitter current is approximately 400 micro-amperes. In the presence of strong signals the emitter current may be reduced to a small value, perhaps 10 micro-amperes. It is then necessary, in order to avoid distortion, that the peak value of the signal currents induced in the emitter circuit should not exceed this value. This requirement makes its desirable that the signal be at a low power level in the controlled stage, and hence it is preferable that the first amplifier stages be subjected to control, wherever other considerations permit.

The second amplification stage employing transistor 11 also provides amplification of the applied signal. The signal applied through the capacitance 32 to the base 29 induces a current in the base emitter circuit, which current in turn produces a signal current in the collector-emitter circuit. The current from the collector 31 establishes a voltage in the parallel resonant circuit load impedance consisting of inductance 34 and capacitance 35. Since this circuit is tuned to resonate at the frequency of a desired signal, the desired signal is amplified more than signals of adjacent frequencies.

The transistor 13 detects the modulated signal and derives a control voltage of proper polarity for control of the amplification of transistor 10. The bias of transistor 13 is adjusted by means of the biasing resistances to a point such that only negative peaks of the alternating signal applied to the base electrode from transistor 11 cause current flow in the emitter circuit. When this condition is established, the currents in the emitter circuit have an amplitude depending on the amplitude of the modulated signal. The presence of modulation components is undesired in the control voltage. Filter capacitor 45 serves to average out the modulation component and to produce a control voltage at the automatic gain control bus 51 which is relatively steady. Decoupling with respect to signal frequencies in the bus 51 is further provided by the choke 52 coupled between the base 14 of the controlled transistor 10 and the automatic gain control bus 51.

Prior to a detailed consideration of the control voltage action, detection action in the transistor 13 may be described. In a manner which is now well known, the signal currents injected into the base produce corresponding currents in the collector circuit. These collector currents are amplified versions of the currents flowing in the base circuit, and develop across resistor 49 a voltage corresponding to the modulations impressed upon the carrier signal. The capacitor 46 provides a short circuit path for the carrier wave components which are present in the collector circuit currents. An amplified detected voltage thus appears at the collector 43 of transistor 13 and at the amplifier output terminal 53.

In accordance with the invention, a PNP type transistor is employed to derive the control voltage which is used to modify the amplification of an NPN transistor by adjustment of its emitter current. The use of complementary transistors provides the desired polarity of control voltage and change of sign. In the presence of a signal in the transistor 13, a control voltage of negative polarity is produced which increases with increased signal strength. The current flowing in the emitter 15 of transistor 10 is dependent on the voltage existing between the base 14 and the emitter 15. By virtue of the voltage divider illustrated, the base 14 assumes a potential which is less negative than the potential of the emitter 15. When a control voltage is produced which increases the negative potential of the base 14, the voltage difference between the base 14 and emitter 15 is reduced, thereby tending to reduce the current flow in the base emitter circuit.

Since the control voltage action is essentially a current control, it is necessary that the control voltage be supplied by a source which can supply the necessary current without adversely affecting its operation. In order to achieve maximum control of the amplifier transistor 10 it is usually necessary that the current in the base emitter circuit be reduced from several hundred micro-amperes to a value on the order of 10 micro-amperes. For this reason, it is desirable that the transistor 13 be capable of supplying control power sufficient to achieve this reduction. In order to increase the efficiency of feedback operation while still preventing coupling at signal frequencies between the control stage and detector, the coupling means in the gain control circuit should preferably employ reactive impedances such as the inductance 52 illustrated rather than energy dissipating resistances.

Figure 2:
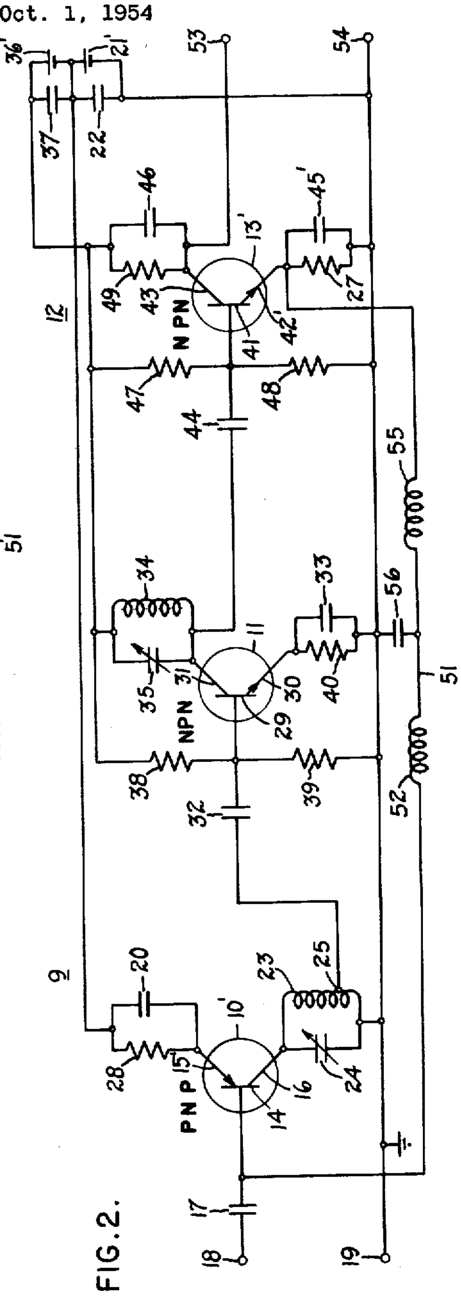
Fig. 2 is a second embodiment of the present invention also adapted to serve as the amplifier and demodulator of an amplitude modulated signal.

In the embodiment previously described, an NPN type transistor was subjected to emitter current control by a transistor of the complementary PNP type. In Fig. 2, a PNP type transistor is subjected to control by a NPN type transistor. In addition, certain refinements in filter circuitry have been incorporated. It may be noted that Fig. 2 is similar to Fig. 1 with the exceptions above numerated, hence for brevity of discussion, only the differences will be discussed. The components which are retained in altered form have been designated with primed reference numerals, while identical components are identified by identical reference numerals.

The amplification system disclosed in Fig. 2 employs a first transistor 10′ of the PNP type, and a control voltage producing transistor 13′ of the NPN type. The emitter 15′ of transistor 10′ is shown with an arrow indicating the appropriate current polarity as is the emitter 42′ of transistor 13′. In order to provide bias of proper polarity, sources 36′ and 21′ are provided, having their polarities reversed with respect to ground and the other circuitry illustrated in Fig. 1. Source 21′ has its negative terminal connected to ground, while source 36′ has its negative terminal connected to the positive terminal of source 21′.

In order to heighten the control sensitivity, no resistance corresponding to resistance 26 is provided in the second embodiment. In the previous embodiment resistance 26 serves to stabilize the operating points of transistor 10, by tending to reduce variations in base potential. The stabilizing action of the base potential occasions an undesired reduction in freedom of potential variation under the influence of derived automatic gain control potentials. Removal of the resistance 26, while accompanied by a reduction in temperature stability, thus provides more effective control action with many transistors.

A third difference between the embodiment of Fig. 2 and Fig. 1 is the filter network associated with the control voltage circuit. The capacitor 45 has been replaced with a capacitance 45′ having a smaller value than capacitance 45. The value of 45′ should be such as to produce a relatively high impedance with respect to modulation frequencies while presenting a relatively low impedance with respect to carrier frequencies. Coupled to the emitter 42′ is one terminal of an inductance 55 having a relatively high impedance at modulation frequencies. The other terminal of inductance 55 is connected to the automatic gain control bus 51. The automatic gain control bus 51 is connected to ground through a capacitance 56 having a low impedance with respect to modulation frequencies. The presence of inductances 52 and 55 serves to provide additional filtering at modulation frequencies of the control voltage.

In operation, the NPN transistor 13′ produces a voltage of positive polarity whose magnitude increases as the signal applied increases in intensity. The positive voltage so produced, contains modulation frequency components, which are eliminated on passage through the filter comprising inductance 55 and capacitance 56. The filtered direct voltage is then applied through inductance 52 to the base electrode of transistor 10′ where it serves to increase the positive potential of the base and thereby decreases the potential between the base and emitter. Reduction of the base-emitter voltage serves to reduce the emitter current and thus the gain of the transistor 10′. In the interest of sensitivity of gain control operation, the operating bias of transistor 10′ should also be selected in the same manner as discussed in connection with transistor 10. The additional filtering inductance 55 should preferably have a low resistance.

The previous embodiments have both illustrated the application of the invention in the controlled amplification of an amplitude modulated signal. It should be apparent that the invention is also applicable to frequency modulated signals and to other types in which a control voltage indicative of the intensity of the signal may be produced by rectification type detection.

It should also be noted that the control voltage producing transistor may be used solely for the production of the control voltage in situations where detection for the purposes of obtaining the demodulated signal is not desired.

While particular embodiments of the invention have been shown and described, it should be understood that the invention is not limited thereto and it is intended in the appended claims to claim all such variations as fall within the spirit of the present invention.

What we claim as new and desired to secure by Letters Patent of the United States is:

1. In an amplification system the combination comprising, a first semiconductor device including base and emitter electrodes and arranged to amplify applied waves, a second semiconductor device of a type complementary to said first device, an emitter and a collector electrode therefor, means for providing D.C. bias potentials to said devices for establishing D.C. operating points and a point of reference potential, means for applying a signal across said base and said point of reference potential, the output of said first device being coupled to said second device, means for deriving a direct potential at the emitter of said second device having a magnitude which increases with the amplitude of applied waves, a transfer network for applying said direct potential to said base electrode so as to modify the current flowing in said first emitter electrode for control of the amplification of said first semiconductor device, and means for connecting an output from said collector to said point of reference potential.

2. In an electric wave responsive system, the combination comprising a first semiconductor device arranged to amplify applied waves, a base electrode and an emitter electrode therefor, a second semiconductor device of a type complementary to said first device, a second emitter electrode and a collector electrode therefor, means for providing D.C. bias potentials to said devices for establishing D.C. operating points and a point of reference potential, means for applying a signal across said base and said point of reference potential, the output of said first device being coupled to said second device, means for deriving a direct potential at said second emitter having a magnitude which increases with the amplitude of the applied waves, a transfer network traversed by substantially all of the current flowing to said base electrode connected in gain controlling relationship between said second emitter and said base electrode, means for connecting an output from said collector to said point of reference potential, and a stabilizing resistor connected between said base and emitter electrodes of said first device traversed by the remainder of the current flowing to said base electrode.

3. In an electric wave responsive system, the combination comprising a first semiconductor device arranged to amplify applied waves, a base electrode and an emitter electrode therefor, a second semiconductor device of a type complementary to said first device, a second emitter and a collector electrode therefor, means for providing D.C. bias potentials to said devices for establishing D.C. operating points and a point of reference potential, means for applying a signal across said base and said point of reference potential, the output of said first device being coupled to said second device, means for deriving a direct potential at said second emitter having a magnitude which increases with the amplitude of applied waves, and a transfer network traversed by all of the current flowing to said base electrode connected in gain controlling relationship between said second emitter and said base electrode.

4. In an electric wave responsive system, the combination comprising a first semiconductor device arranged to amplify applied waves, a base electrode and an emitter electrode therefor, a second semiconductor device of a type complementary to said first device, a second emitter and a collector electrode therefor, a source of energizing potentials for said semiconductor devices having two terminals, a first resistance having one terminal connected to one terminal of said source and the other terminal to said base electrode, a second resistance having one terminal connected to the other terminal of said source and the other terminal to said second emitter electrode, means for applying a signal across said base and said other terminal of said source, the output of said first semiconductor device being coupled to said second semiconductor device, means for deriving a direct potential at the emitter of said second device having a magnitude which increases with the amplitude of applied waves, a transfer network conductively connecting said other terminals of said resisances for base potential adjustment and gain control, and means for connecting an output from said collector to said other terminal of said source.

References Cited in the file of this patent

UNITED STATES PATENTS

| | | |
|---|---|---|
| 1,849,189 | Holden | Mar. 15, 1932 |
| 1,869,331 | Ballantine | July 26, 1932 |
| 2,144,921 | Hunt | Jan. 24, 1939 |
| 2,544,211 | Barton | Mar. 6, 1951 |
| 2,751,466 | Bopp | June 19, 1956 |
| 2,761,916 | Barton | Sept. 4, 1956 |
| 2,762,873 | Goodrich | Sept. 11, 1956 |
| 2,762,875 | Fischer | Sept. 11, 1956 |
| 2,802,067 | Zawels | Aug. 6, 1957 |

OTHER REFERENCES

Shea text, "Principles of Transistor Circuits," pages 296–297, pub. 1953 by John Wiley & Sons, Inc., N.Y. Copy in Div. 69.

Article by Sziklai, Proc. of IRE, June 1933, pp. 717–720. Copy in 179–171–MB.

Sziklai et al.: "A Study of Transistor Circuits for Television," Proceedings of the I.R.E., June 1953, pp. 708–717. Copy in Class. Div. II.